US008987742B2

(12) United States Patent
Lee et al.

(10) Patent No.: US 8,987,742 B2
(45) Date of Patent: Mar. 24, 2015

(54) LIQUID CRYSTAL DISPLAY AND METHOD OF MANUFACTURING THE SAME

(75) Inventors: Je-Hun Lee, Seoul (KR); Do-Hyun Kim, Seoul (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 13 days.

(21) Appl. No.: 13/452,287

(22) Filed: Apr. 20, 2012

(65) Prior Publication Data

US 2012/0205651 A1   Aug. 16, 2012

Related U.S. Application Data

(63) Continuation of application No. 12/509,893, filed on Jul. 27, 2009, now Pat. No. 8,164,152.

(30) Foreign Application Priority Data

Aug. 28, 2008   (KR) .................. 10-2008-0084555

(51) Int. Cl.
*H01L 33/08* (2010.01)
*H01L 27/12* (2006.01)
*H01L 29/786* (2006.01)

(52) U.S. Cl.
CPC ........ *H01L 27/1225* (2013.01); *H01L 29/7869* (2013.01)
USPC .............................. 257/59; 349/141; 349/142

(58) Field of Classification Search
USPC ..................................... 349/141–142; 257/59
See application file for complete search history.

(56) References Cited

U.S. PATENT DOCUMENTS

| 7,910,932 | B2 * | 3/2011 | Marks et al. | 257/72 |
| 2007/0002244 | A1 * | 1/2007 | Park et al. | 349/141 |
| 2007/0126969 | A1 * | 6/2007 | Kimura et al. | 349/141 |
| 2008/0116459 | A1 * | 5/2008 | Chen et al. | 257/59 |
| 2009/0273750 | A1 * | 11/2009 | Liao et al. | 349/126 |
| 2010/0065837 | A1 * | 3/2010 | Omura et al. | 257/43 |

FOREIGN PATENT DOCUMENTS

| KR | 1019980040056 | 8/1998 |
| KR | 1020030042080 | 5/2003 |
| KR | 1020050118537 | 12/2005 |
| KR | 1020060133981 | 12/2006 |
| KR | 1020080048936 | 6/2008 |

OTHER PUBLICATIONS

Korean Office Action Dated Aug. 4, 2014.

\* cited by examiner

*Primary Examiner* — Matthew W Such
*Assistant Examiner* — Ali Naraghi
(74) *Attorney, Agent, or Firm* — F. Chau & Associates, LLC

(57) ABSTRACT

A liquid crystal display and a method of manufacturing the same are provided. The liquid crystal display includes an insulating substrate, a gate electrode formed on the insulating substrate, an oxide semiconductor layer formed on the gate electrode, an etch stopper formed on the oxide semiconductor layer in a channel area, a common electrode formed on the insulating substrate, source and drain electrodes separated from each other on the etch stopper and extending to an upper portion of the oxide semiconductor layer, a passivation layer formed on the etch stopper, the common electrode, the source and drain electrodes, and a pixel electrode formed on the passivation layer and connected to the drain electrode.

17 Claims, 8 Drawing Sheets

LIQUID CRYSTAL DISPLAY AND METHOD OF MANUFACTURING THE SAME

CROSS-REFERENCE TO RELATED APPLICATION

This application is a continuation application of U.S. patent application Ser. No. 12/509,893 filed on Jul. 27, 2009 now U.S. Pat. No. 8,164,152 which claims priority from Korean Patent Application No. 10-2008-0084555 filed on Aug. 28, 2008 in the Korean Intellectual Property Office, the disclosures of which are herein incorporated by reference in their entireties.

BACKGROUND OF THE INVENTION

1. Technical Field

The present invention relates to a liquid crystal display, and more particularly, to a liquid crystal display having a common electrode and pixel electrodes formed on a single substrate, and a method of manufacturing same.

2. Discussion of the Related Art

A liquid crystal display ("LCD") is one of the most commonly used flat panel displays. The LCD, which includes two panels having a plurality of electrodes thereon and a liquid crystal layer interposed therebetween, controls the transmittance of incident light by applying voltages to the electrodes to rearrange liquid crystal molecules of the liquid crystal layer.

The LCD has several desirable characteristics, such as an ultra-thin profile, low power consumption, and decreased generation of potentially harmful electromagnetic waves. However, an LCD may have relatively poor lateral visibility compared with front visibility. In this regard, various attempts to overcome poor lateral visibility have been made, including liquid crystal alignment and driving methods. For example, LCDs having a wide viewing angle in a patterned vertical alignment ("PVA") mode, and an in-plane switching (IPS) mode have been developed.

However, the PVA mode LCD may exhibit textures or afterimages. In the IPS mode LCD, since the aperture ratio may be deteriorated by a common electrode, resulting in a reduction in the response speed of a liquid crystal, the demand for a backlight unit implementing high brightness has increased.

To achieve a wide viewing angle and high brightness, a Plane to Line Switching (PLS) mode LCD adopting the IPS mode has been proposed. In the case of a high resolution and large-sized liquid crystal display driving at a high speed of 120 Hz or greater, however, it is desirable to develop thin film transistors having high mobility characteristics in channel areas.

SUMMARY OF THE INVENTION

Embodiments of the present invention provide a liquid crystal display (LCD) which can achieve high transmission and high-speed driving operation, and a method of manufacturing an LCD which can achieve high transmission and high-speed driving operation.

The above and other objects of the present invention will be described in or be apparent from the following description of the preferred embodiments.

According to an embodiment of the present invention, a liquid crystal display includes an insulating substrate, a gate electrode formed on the insulating substrate, an oxide semiconductor layer formed on the gate electrode, an etch stopper funned on the oxide semiconductor layer in a channel area, a common electrode formed on the insulating substrate, source and drain electrodes separated from each other on the etch stopper and extending to an upper portion of the oxide semiconductor layer, a passivation layer formed on the etch stopper, the common electrode, the source and drain electrodes, and a pixel electrode formed on the passivation layer and connected to the drain electrode.

According to an embodiment of the present invention, a liquid crystal display includes an insulating substrate, a gate electrode formed on the insulating substrate, an oxide semiconductor layer formed on the gate electrode, a common electrode formed on the insulating substrate, source and drain electrodes separated from each other on the oxide semiconductor layer, a passivation layer formed on the oxide semiconductor layer, the common electrode, and the source and drain electrodes, and a pixel electrode formed on the passivation layer and connected to the drain electrode.

According to an embodiment of the present invention, a method of manufacturing a liquid crystal display includes forming a gate electrode on an insulating substrate, forming an oxide semiconductor layer on the gate electrode, forming an etch stopper on a channel area of the oxide semiconductor layer, forming a lower wire layer and an upper wire layer on the resultant structure, forming a common electrode comprised of the lower wire layer, and source and drain electrodes comprised of the lower wire layer and the upper wire layer, by etching the lower wire layer and the upper wire layer, forming a passivation layer on the etch stopper, the common electrode, and the source and drain electrodes, and forming a pixel electrode on the passivation layer and connected to the drain electrode, wherein the source and drain electrodes are separated from each other on the etch stopper and extend onto an upper portion of the oxide semiconductor layer.

BRIEF DESCRIPTION OF THE DRAWINGS

Embodiments of the present invention can be understood in more detail from the following description taken in conjunction with the attached drawings in which.

DETAILED DESCRIPTION OF EMBODIMENTS OF THE INVENTION

Figure 1:
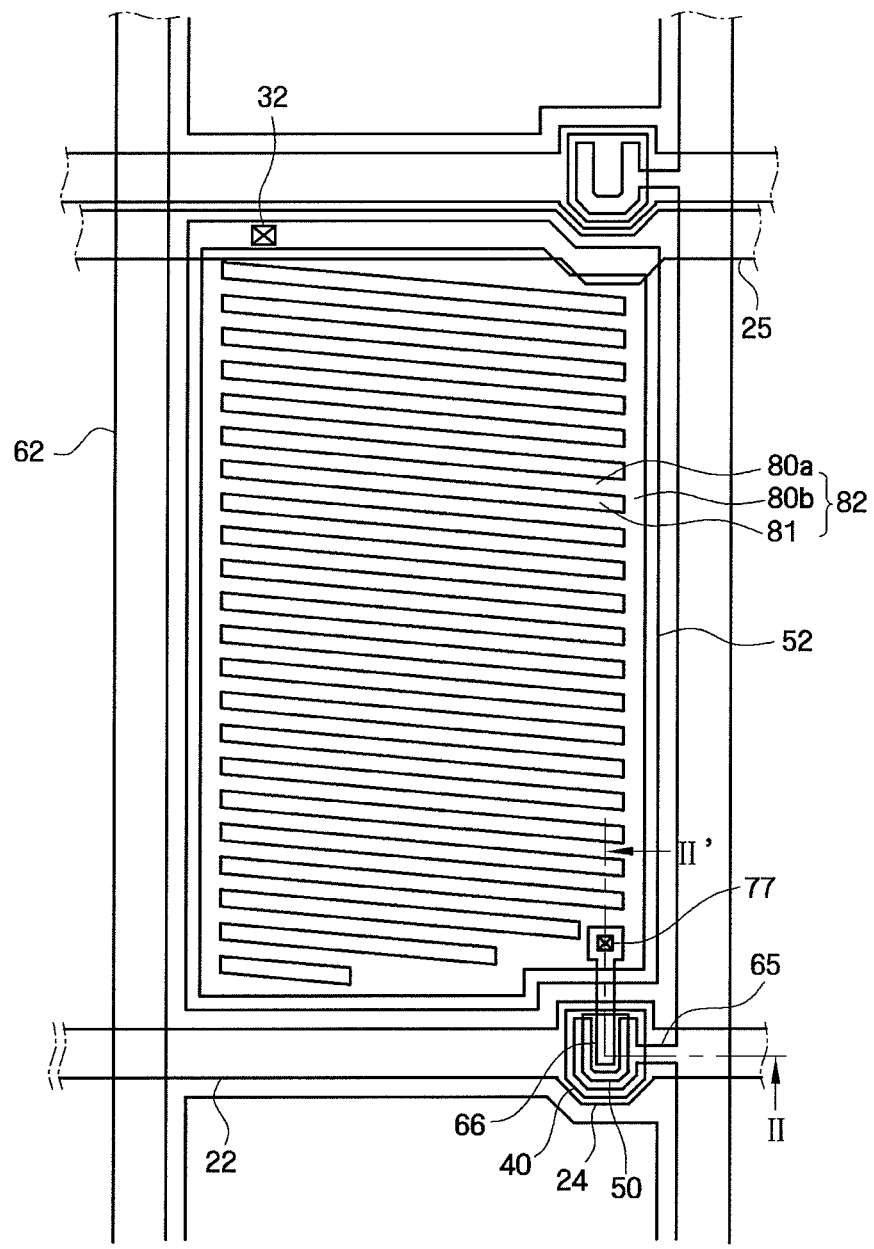
FIG. 1 is a layout view of a lower substrate of an LCD according to an embodiment of the present invention.

Embodiments of the present invention and methods of accomplishing the same may be understood more readily by reference to the following detailed description and the accompanying drawings. The present invention may, however, be embodied in many different forms and should not be construed as being limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. An LCD according to embodiments of the present invention includes a lower substrate including a thin film transistor array, an upper substrate facing and spaced apart from the lower substrate, and a liquid crystal layer interposed between the lower substrate and the upper substrate.

Figure 2:
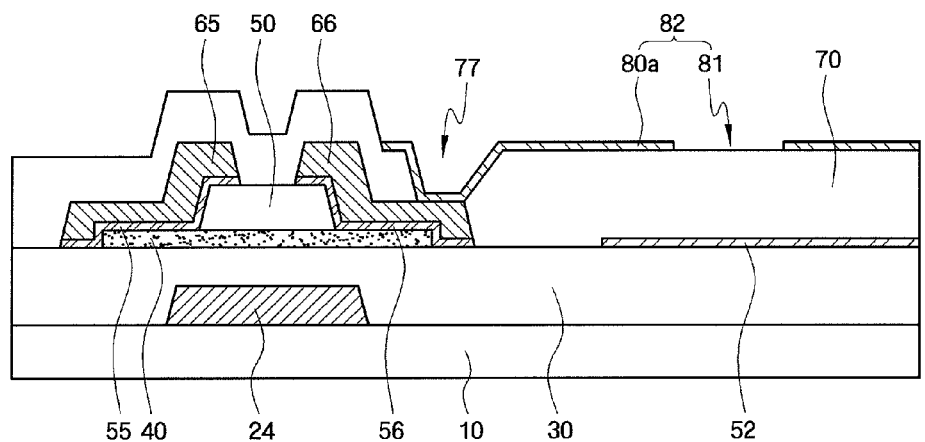
FIG. 2 is a sectional view of the lower substrate taken along the line II-II' of FIG. 1.

FIG. 1 is a layout view of a lower substrate of an LCD according to an embodiment of the present invention, and FIG. 2 is a sectional view of the lower substrate taken along the line II-II' of FIG. 1.

Referring to FIGS. 1 and 2, the lower substrate includes gate wires 22 and 24 for transmitting a gate signal on an insulating substrate 10 made of transparent glass or plastic. The gate wires 22 and 24 include a gate line 22 extending a horizontal direction and a gate electrode 24 connected to the gate line 22 and protruding from the gate line 22, forming part of a thin film transistor.

A common electrode line 25 for transmitting a common voltage is formed on the insulating substrate 10. The common electrode line 25 is formed in a transverse direction that is substantially parallel with the gate line 22.

The gate wires 22 and 24 and the common electrode line 25 can be made of, for example, an aluminum (Al) group metal, such as aluminum (Al) and an aluminum (Al) alloy, a silver (Ag) group metal, such as silver (Ag) and a silver (Ag) alloy, a copper (Cu) group metal, such as copper (Cu) and a copper (Cu) alloy, a molybdenum (Mo) group metal, such as molybdenum (Mo) and a molybdenum (Mo) alloy, chromium (Cr), titanium (Ti), or tantalum (Ta). According to an embodiment, the gate wires 22 and 24 and the common electrode line 25 can have a multilayer structure having two conductive layers (not shown) with different physical properties. A first conductive layer can be made of a metal having low resistivity, for example, an aluminum (Al) group metal, a silver (Ag) group metal, or a copper (Cu) group metal, in order to reduce signal delay or voltage drop. The other conductive layer can be made of a different material having physical, chemical and electrical contact characteristics like those of zinc oxide (ZnO), indium tin oxide (ITO) and indium zinc oxide (IZO), such as, for example, a molybdenum (Mo) group metal, chromium (Cr), tantalum (Ta), or titanium (Ti). For example, such a composition can be a chromium lower layer and an aluminum (alloy) upper layer, or an aluminum (alloy) lower layer and a molybdenum (alloy) upper layer. However, the gate wires 22 and 24 and the common electrode line 25 can be made of various metals or conductors in addition to the materials described above.

A gate insulating layer 30 made of silicon oxide (SiOx) or silicon nitride (SiNx) is formed on the insulating substrate 10, the gate wires 22 and 24, and the common electrode line 25.

An oxide semiconductor layer 40 made of an oxide of a material selected from zinc (Zn), indium (In), gallium (Ga), tin (Sn), and combinations thereof, is formed on the gate insulating layer 30. For example, as the oxide semiconductor layer 40, a composite oxide, such as ZnO, InZnO, InGaO, InSnO, ZnSnO, GaSnO, GaZnO, GaZnSnO, or GaInZnO, can be used. The oxide semiconductor layer 40 has desirable semiconductor characteristics including, for example, effective mobility of electric charges that is about 2 to about 100 times as high as hydrogenated amorphous silicon and an On/Off current ratio in the range of $10^5$ to $10^8$.

In addition, the oxide semiconductor layer 40 has a band gap in the range of about 3.0 eV to about 3.5 eV, and generates a relatively small amount of leakage photocurrent with respect to visible light. Accordingly, an instantaneous afterimage phenomenon, which may happen to an oxide thin film transistor, can be avoided. In addition, since it is not necessary to separately provide a light blocking layer below the oxide thin film transistor, the aperture ratio of the LCD can be enhanced accordingly. In order to increase characteristics of an oxide semiconductor, elements in groups 3 through 5 of the periodic table, called transition metals, may be additionally included in the oxide semiconductor layer 40. Further, since the oxide semiconductor layer 40 in an amorphous phase has high mobility of electric charges and is employed in a conventional manufacturing process in which amorphous silicon is used, the oxide semiconductor layer can be advantageously applied to a large-sized display.

An etch stopper 50 is formed at an area overlapping the gate electrode 24 on the oxide semiconductor layer 40. The etch stopper 50 prevents a channel area of the oxide semiconductor layer 40 from being damaged due to etching in a subsequent process of forming data wires 55, 56, 62, 65, and 66. An inorganic material, such as oxide, nitride, or oxynitride, can be used as the etch stopper 50. Examples of the etch stopper 50 may include silicon oxide (SiOx), silicon nitride (SiNx), silicon oxynitride (SiOxNy), aluminum oxide (AlOx), hafnium oxide (HfOx), and the like.

Data wires 55, 56, 62, 65, and 66 are formed on the oxide semiconductor layer 40, the etch stopper 50 and the gate insulating layer 30. The data wires 55, 56, 62, 65, and 66 extend in a longitudinal direction, and include a data line 62 crossing the gate line 22 to define a pixel, source electrodes 55 and 65 branching from the data line 62 and extending to the upper portion of the oxide semiconductor layer 40, and drain electrodes 56 and 66 formed on the oxide semiconductor layer 40, the drain electrodes 56 and 66 separated from the source electrodes 55 and 65 and located opposite to each other with respect to the gate electrode 24 or the channel area of the oxide thin film transistor.

The source electrodes 55 and 65 include a lower source layer 55 in contact with the oxide semiconductor layer 40, and an upper source layer 65 formed on the lower source layer 55. The drain electrodes 56 and 66 include a lower drain layer 56 in contact with the oxide semiconductor layer 40, and a lower drain layer 56 formed on the upper drain layer 66. The lower source layer 55 and the upper source layer 65 have substantially the same patterns as each other, and the lower drain layer 56 and the upper drain layer 66 have substantially the same patterns as each other.

A common electrode 52 is formed in a pixel area on the gate insulating layer 30. The common electrode 52 is connected to the common electrode line 25 through a contact hole 32 formed in the gate insulating layer 30 and a common voltage is applied to the common electrode 52. The common electrode 52 is a substantially rectangular shaped plane electrode arranged in a matrix form, and covers most of the area defined between the gate lines 22 and the data lines 62, called a pixel area. The common electrode 52 is formed on the same level and is made of the same material as the lower source layer 55 and the lower drain layer 56.

The lower source layer 55 and the lower drain layer 56 preferably have good contact characteristics with the oxide semiconductor layer 40, and the common electrode 52 preferably includes a transparent conductor. In order to satisfy these properties, for example, the lower source layer 55, the lower drain layer 56, and the common electrode 52 may be made of oxide with, for example, indium (In), zinc (Zn), tin (Sn), or the like. Specifically, a transparent conductor such as indium tin oxide (ITO), indium zinc oxide (IZO), or the like, may be used.

If the common electrode 52 is as thin as about 300 Å to 500 Å, the transparency of the common electrode 52 may be ensured even with use of a metallic material. The lower source layer 55, the lower drain layer 56, and the common electrode 52 may also be made of aluminum (Al), copper (Cu), silver (Ag), molybdenum (Mo), chromium (Cr), titanium (Ti), tantalum (Ta), nickel (Ni), cobalt (Co), or alloys of these materials. In order to produce the alloy, molybdenum (Mo), tungsten (W), niobium (Nb), zirconium (Zr), vanadium (V), oxygen (O), or nitrogen (N) may further be added.

The upper source layer 65 and the upper drain layer 66 may be made of aluminum (Al), copper (Cu), silver (Ag), molybdenum (Mo), chromium (Cr), titanium (Ti), tantalum (Ta), nickel (Ni), cobalt (Co), or alloys of these materials. For example, the upper source layer 65 and the upper drain layer 66 may be made of a conductive material with low resistance, for example, Al containing metal such as Al or Al alloy, Ag containing metal such as Ag or Ag alloy, or Cu containing metal such as Cu or Cu alloy.

The source electrodes 55 and 65 overlap at least partially with the semiconductor layer 40 and the etch stopper 50. The drain electrodes 56 and 66 are opposite to the source electrodes 55 and 65 with respect to the channel area of the oxide thin film transistor and overlap at least partially with the semiconductor layer 40 and the etch stopper 50. Non-overlapping portions, where the source electrodes 55 and 65 and the drain electrodes 56 and 66 are not formed, occur in the channel areas, where the etch stopper 50 is exposed.

A passivation layer 70 is formed on the data wires 55, 56, 62, 65, and 66 and the exposed portion of the etch stopper 50. The passivation layer 70 may be made of an inorganic material such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD). In addition, the passivation layer 70 may have a double-layered structure comprised of a lower inorganic film and an upper organic film.

A contact hole 77 exposing the drain electrode 66 is formed in the passivation layer 70. A pixel electrode 82, electrically connected to the drain electrodes 56 and 66 via the contact hole 77, is formed on the passivation layer 70. The pixel electrode 82 may be formed of a transparent conductor such as ITO (Indium Tin Oxide) or IZO (Indium Zinc Oxide), or a reflective conductor such as Al. The pixel electrode 82 having a data voltage applied thereto creates an electric field, together with the common electrode 52, thereby rotating liquid crystal molecules in the liquid crystal layer interposed between the lower substrate and the upper substrate.

The pixel electrode 82 includes a plurality of main field generating portions 80a having stripe patterns, and connecting portions 80b connecting the plurality of main field generating portions 80a. A cut-out portion 81 is formed in each space between two adjacent main field generating portions 80a. The cut-out portion 81 is in the shape of a rectangle or other closed curve.

The pixel electrode 82 is mostly occupied by the main field generating portions 80a, which are shaped as bars and extend substantially in a transverse direction. In order to facilitate rotation of liquid crystal molecules based on a horizontal electric field, the main field generating portions 80a are disposed at a predetermined angle with respect to the gate line 22, which is referred to as a pretilt angle. In other words, the main field generating portions 80a are tilted by a predetermined angle with respect to an alignment direction of an alignment film positioned on the pixel electrode 82. Embodiments of the invention will be described by way of an example where the alignment film is aligned with respect to the gate line 22 in a transverse direction.

When an electric field is generated between the main field generating portions 80a and the common electrode 52, the generated electric field includes horizontal electric field components parallel to the lower substrate. When viewed from the top of the lower substrate, the horizontal electric field components are perpendicular to the sides of the main field generating portions 80a. Accordingly, in a case where liquid crystal molecules having positive dielectric anisotropy are arranged at a pretilt angle with respect to the main field generating portions 80a in the absence of an applied electric field, the liquid crystal molecules are easily rotated relative to the horizontal electric field created perpendicular to the main field generating portions 80a. As described above, if the main field generating portions 80a are inclined with respect to the initially aligned direction of the liquid crystal molecules by the pretilt angle, the rotation of liquid crystal molecules is facilitated, thereby further increasing the response speed.

The pretilt angle between each of the main field generating portions 80a and the gate line 22 (or the alignment film formed on the lower substrate) is in a range of between approximately 0 and approximately 10 degrees.

In consideration of a change in the brightness and the response speed of liquid crystal molecules, the pretilt angle is may be in a range of between approximately 5 and approximately 15 degrees, or between approximately 9 and approximately 11 degrees.

While FIG. 1, by way example, shows the main field generating portions 80a formed in a transverse direction, the main field generating portions 80a can also be formed in a longitudinal direction.

A method of manufacturing the lower substrate according to an embodiment of the present invention will be described with reference to FIGS. 1 through 9. FIGS. 3 through 9 are sectional views illustrating manufacturing of the lower substrate shown in FIG. 2.

Figure 3:
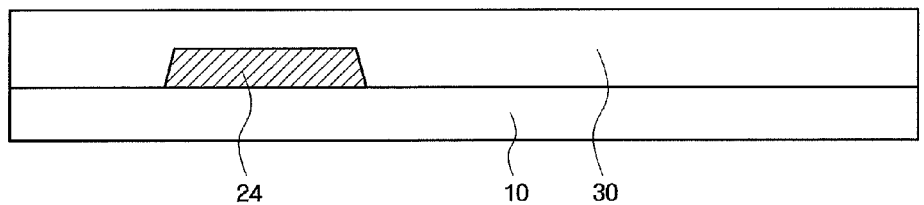
FIGS. 3 through 9 are sectional views illustrating manufacturing the lower substrate shown in FIG. 2.

Referring first to FIGS. 1 through 3, the gate line 22, the gate electrode 24, and the common electrode line 25 are formed on the insulating substrate 10. The insulating substrate 10 may be a transparent glass or plastic material, for example, soda lime glass, or borosilicate glass. The gate wires 22 and 24 and the common electrode line 25 may be formed by sputtering. In patterning the gate wires 22 and 24 and the common electrode line 25, wet etching or diy etching may be used. The wet etching can be performed using an etching solution, such as phosphoric acid, nitric acid, or acetic acid. The diy etching can be performed using a chlorine-based etching gas, e.g., $Cl_2$, $BCl_3$, or the like.

Subsequently, the gate insulating layer 30 is formed on the insulating substrate 10, the gate wires 22 and 24, and the common electrode line 25 by plasma enhanced chemical vapor deposition (PECVD), reactive sputtering, or the like.

Figure 4:
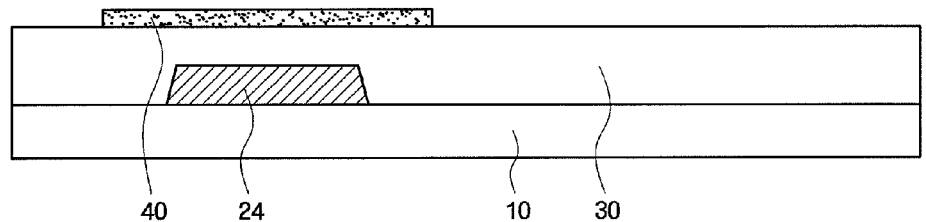

Referring to FIGS. 1 and 4, the oxide semiconductor layer 40 is formed on the gate insulating layer 30. For example, a composite oxide, such as ZnO, InZnO, InGaO, InSnO, ZnSnO, GaSnO, GaZnO, GaZnSnO, or GaInZnO, can be used as the oxide semiconductor layer 40.

Figure 5:
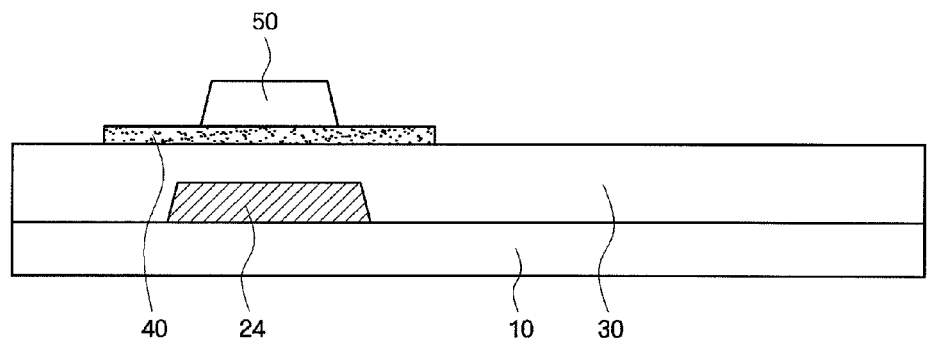

Referring to FIGS. 1 and 5, the etch stopper 50 is formed on the oxide semiconductor layer 40. Silicon oxide (SiOx), silicon nitride (SiNx), silicon oxynitride (SiOxNy), aluminum oxide (AlOx), hafnium oxide (HfOx), or the like, can be used as the etch stopper 50.

Figure 6:
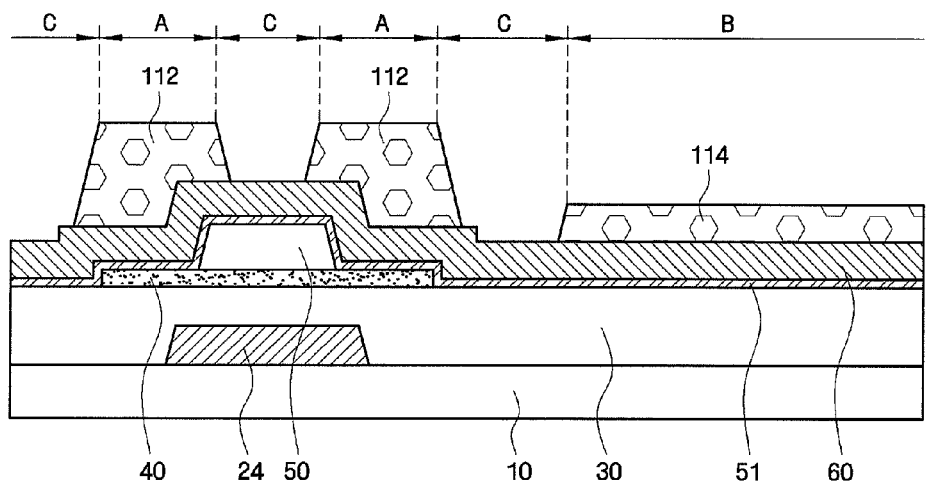

Referring to FIGS. 1 and 6, a lower wire layer 51 and an upper wire layer 60 are sequentially formed on the etch stopper 50, the oxide semiconductor layer 40, and the gate insulating layer 30 by, for example, sputtering. The lower wire layer 51 may be made of oxide with, for example, indium (In), zinc (Zn), tin (Sn), or the like. In more detail, the lower wire layer 51 may be made of a transparent conductor such as indium tin oxide (ITO), indium zinc oxide (IZO). In addition, the lower wire layer 51 may also be made of aluminum (Al), copper (Cu), silver (Ag), molybdenum (Mo), chromium (Cr), titanium (Ti), tantalum (Ta), nickel (Ni), cobalt (Co), or alloys of these materials. In order to produce the alloy, molybdenum (Mo), tungsten (W), niobium (Nb), zirconium (Zr), vanadium (V), oxygen (O), or nitrogen (N) may further be added to the lower wire layer 51. The upper wire layer 60 may be made of aluminum (Al), copper (Cu), silver (Ag), molybdenum (Mo), chromium (Cr), titanium (Ti), tantalum (Ta), nickel (Ni), cobalt (Co), or alloys of these materials.

Next, a photoresist film is coated on the upper wire layer 60, and the photoresist film is exposed and developed using a mask to form to form photoresist patterns 112 and 114. The photoresist patterns 112 and 114 are comprised of areas having different thicknesses. Second portions 112, which are relatively thicker portions, are located on a data wire area A, that is, a potential data wire portion, while first portions 114, which are relatively thinner portions 114, are located on a common electrode area B, that is, a potential common electrode portion. The photoresist film in the area C, other than the data wire area A and the common electrode area B, is removed. For example, the photoresist film on the etch stopper 50 corresponding to the channel area is removed.

The position-dependent thickness of the photoresist film is obtained by several techniques. In order to adjust the amount of light exposure in the areas A, B and C, a slit pattern, a lattice pattern or translucent films are provided on a mask. Further, the photoresist film made of a reflowable material is exposed using a mask with transmissive areas completely transmitting the light and blocking areas completely blocking the light, developed and reflowed, to make the photoresist film partially flow onto areas without the photoresist film, thereby forming the relatively thin photoresist pattern 114.

Figure 7:
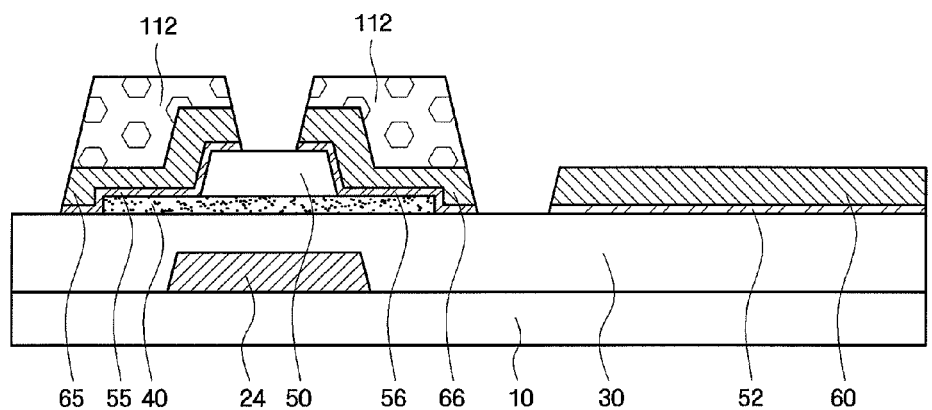

Referring to FIGS. 6 and 7, the upper wire layer 60 and the lower wire layer 51 are etched using the photoresist patterns 112 and 114 as etch masks, thereby forming the source electrodes 55 and 65 including the lower source layer 55 and the upper source layer 65, the drain electrodes 56 and 66 including the lower drain layer 56 and the upper drain layer 66, the common electrode 52, and the upper wire layer 60 disposed on the common electrode 52. The etching may be performed by, for example, wet etching or dry etching The wet etching may employ an etching solution, such as phosphoric acid, nitric acid, or acetic acid. The dry etching may employ a chlorine-based etching gas, e.g., $Cl_2$, $BCl_3$, or the like.

Subsequently, the photoresist patterns 112 and 114 are blanket-etched to remove the relatively thin first portions 114 of the photoresist patterns 112 and 114, exposing the upper wire layer 60 disposed on the common electrode 52. As a result of the blanket etching, the thickness of the relatively thick second portion 112 is reduced. The blanket-etching may be performed by, for example, ashing using oxygen plasma.

Figure 8:
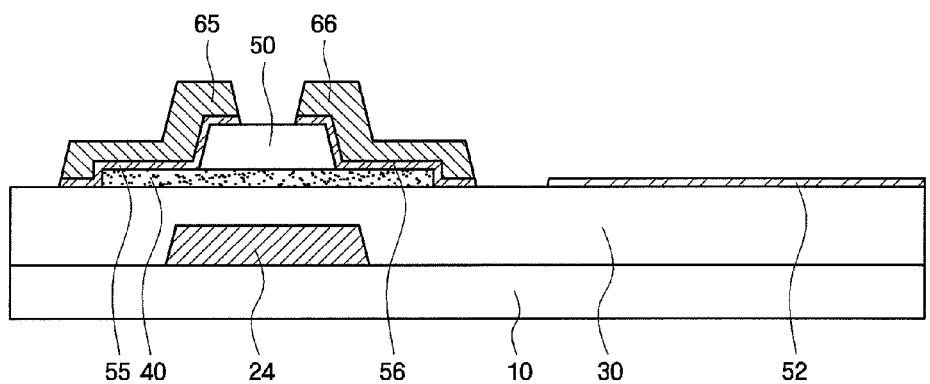

Referring to FIGS. 7 and 8, the exposed upper wire layer 60 is etched using the photoresist pattern 112 as an etch mask. Accordingly, the common electrode 52 is exposed. The etching may be performed by, for example, wet etching or dry etching. The wet etching may employ an etching solution, such as phosphoric acid, nitric acid, or acetic acid. The dry etching may employ a chlorine-based etching gas, e.g., $Cl_2$, $BCl_3$, or the like.

Next, the photoresist pattern 112 is removed by, for example, ashing using oxygen plasma.

Figure 9:
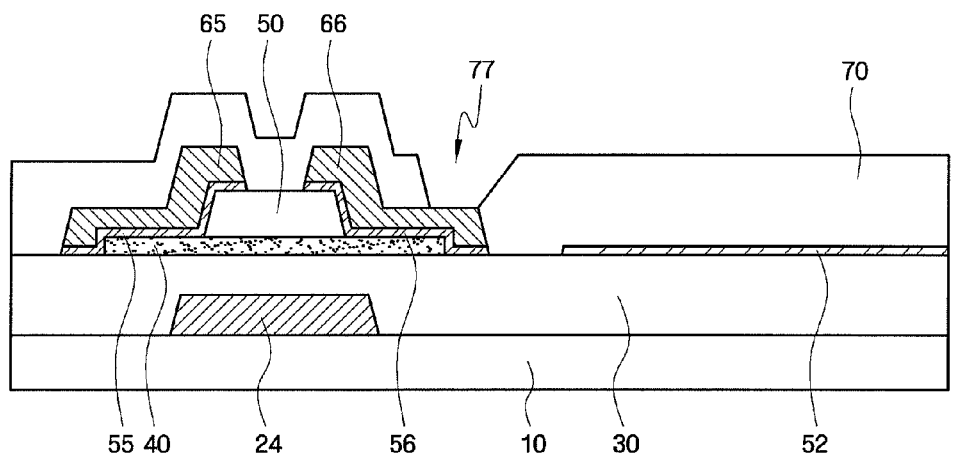

Referring to FIG. 9, the passivation layer 70 is formed on the source electrodes 55 and 65, the drain electrodes 56 and 66, and the common electrode 52. The passivation layer 70 is made of, for example, an inorganic material such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD). In addition, the passivation layer 70 may have a double-layered structure comprised of a lower inorganic film and an upper organic film. Subsequently, the passivation layer 70 is patterned by photolithography to form the contact hole 77 exposing the drain electrode 66.

Referring again to FIG. 2, a conductive layer for forming a pixel electrode is formed on the passivation layer 70, and then patterned, thereby forming the pixel electrode 82 connected to the drain electrodes 56 and 66.

Figure 10:
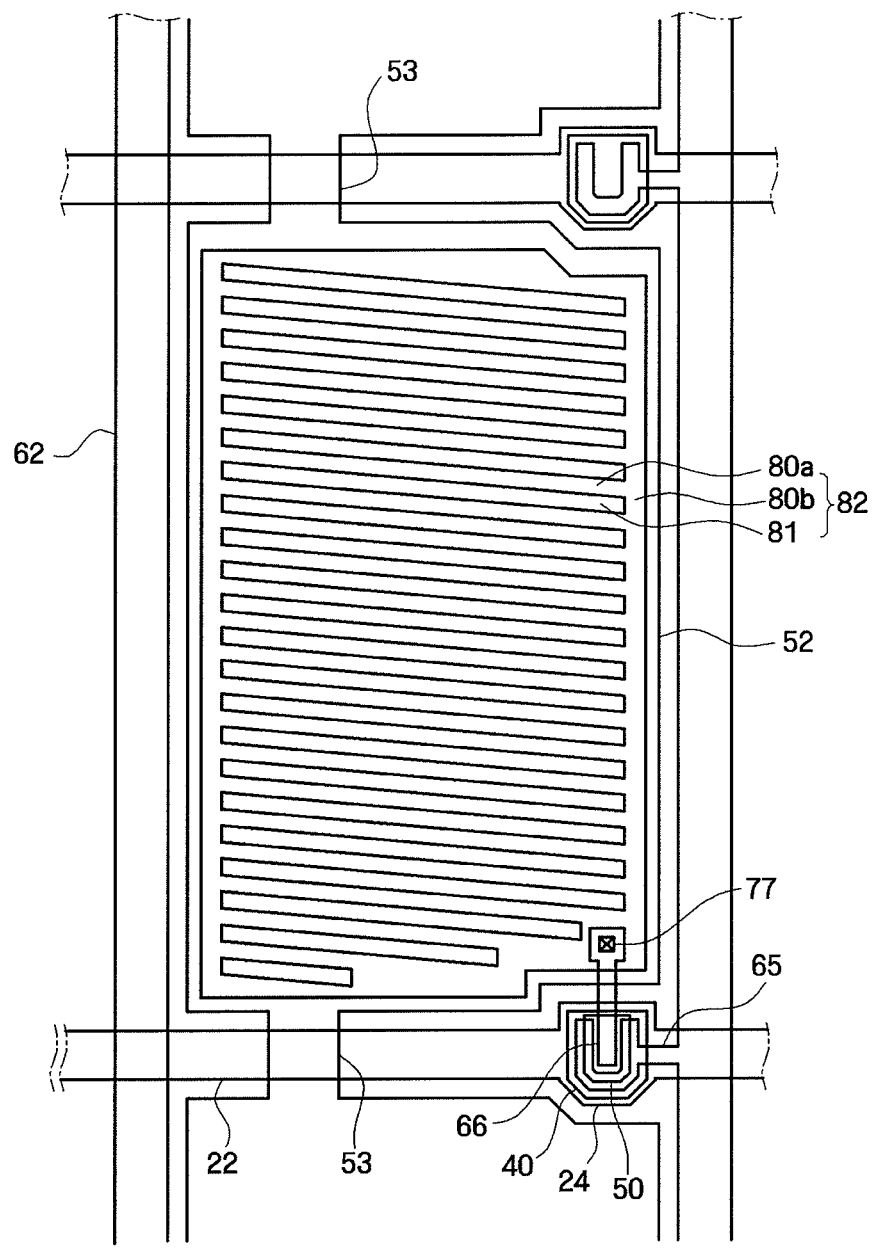
FIG. 10 is a layout view of a lower substrate of an LCD according to an embodiment of the present invention.

An LCD according to an embodiment of the present invention will be described with reference to FIG. 10. FIG. 10 is a layout view of a lower substrate of an LCD according to an embodiment of the present invention. The same reference numerals from FIG. 1 represent the same elements.

Referring to FIG. 10, a separate common electrode line for connecting common electrodes 52 formed at adjacent pixels is provided. That is, the common electrodes 52 formed at adjacent pixels, e.g., upper and lower pixels, are connected to each other by a common electrode connecting portion 53 made of the same material and formed on the same layer with the common electrode 52. The common electrode connecting portion 53 is formed on the gate insulating layer 30 and is insulated from the gate line 22.

Figure 11:
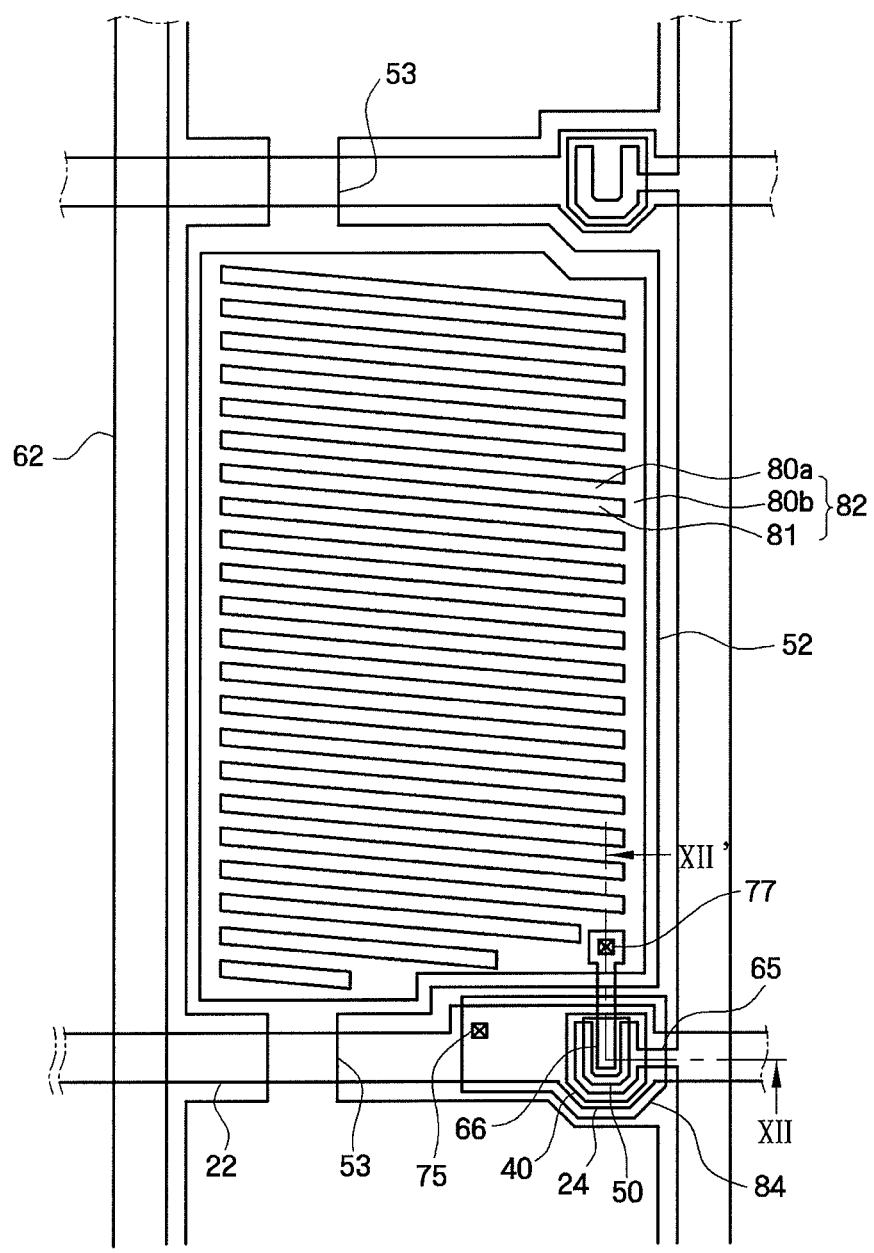
FIG. 11 is a layout view of a lower substrate of an LCD according to an embodiment of the present invention.
Figure 12:
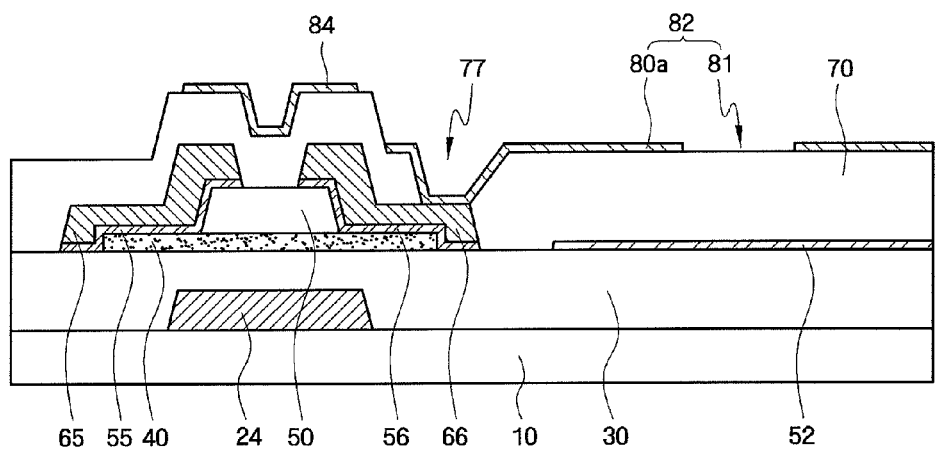
FIG. 12 is a sectional view of the lower substrate taken along the line XII-XII' of FIG. 12.

An LCD according to an embodiment of the present invention will be described with reference to FIGS. 11 and 12. FIG. 11 is a layout view of a lower substrate of an LCD according to an embodiment of the present invention, and FIG. 12 is a sectional view of the lower substrate taken along the line XII-XII' of FIG. 12. The same reference numerals from FIG. 10 represent the same elements.

Referring to FIGS. 11 and 12, an additional gate electrode 84 overlapping with the gate electrode 24 and the oxide semiconductor layer 40 is formed on the passivation layer 70. The additional gate electrode 84 may be made of the same material and on the same layer with the pixel electrode 82. The additional gate electrode 84 is connected to the gate electrode 24 via the contact hole 75 formed in the passivation layer 70 and the gate insulating layer 30. Accordingly, when a gate-on voltage is applied through the gate line 22, a channel area is formed on the oxide semiconductor layer 40 by the gate electrode 24 formed under the oxide semiconductor layer 40 and the additional gate electrode 84 formed above the oxide semiconductor layer 40, thereby facilitating signal transfer between the source electrodes 55 and 65 and the drain electrodes 56 and 66.

While the common electrode connecting portion 53 for connecting the common electrodes 52 formed at adjacent pixels has been illustrated in FIG. 11 by way of example, the embodiments are not limited to the illustrated example. For example, instead of the common electrode connecting portion 53, a separate common electrode line made of the same material with the gate line 22 may be provided on the same layer with the gate line 22. The common electrode line may be electrically connected with the common electrode 52 through a contact hole.

Figure 13:
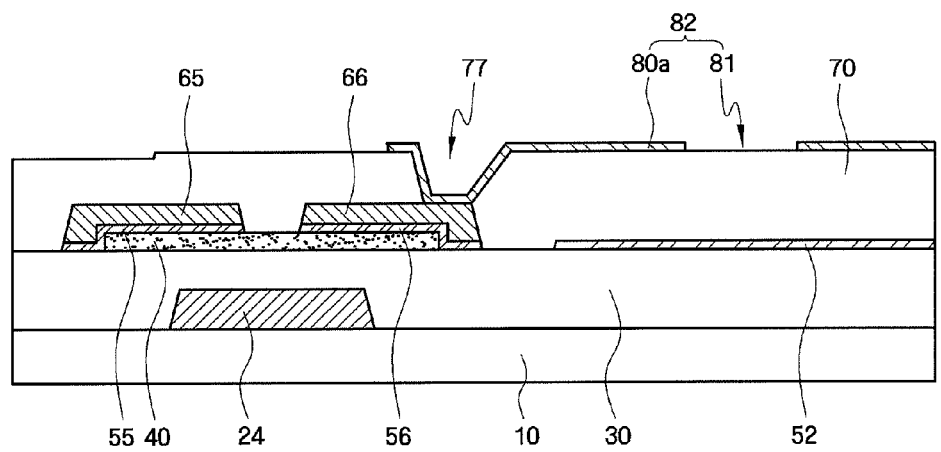
FIG. 13 is a layout view of a lower substrate of a LCD according to an embodiment of the present invention

An LCD according to an embodiment of the present invention will be described with reference to FIG. 13. FIG. 13 is a layout view of a lower substrate of an LCD according to an embodiment of the present invention.

The same reference numerals from FIG. 2 represent the same elements.

As shown in FIG. 13, a separate etch stopper for protecting an oxide semiconductor layer 40 is provided on the oxide semiconductor layer 40. In this case, the oxide semiconductor layer 40 is made of, for example, a material having high etching selectivity relative to a common electrode 52. For example, when a transparent conductor such as ITO or IZO is used as the common electrode 52, the oxide semiconductor layer 40 may be made of an oxide without indium (In). In patterning the common electrode 52 in the absence of an etch stopper, the oxide semiconductor layer 40 is highly likely to be etched. Since indium (In) has a high etch rate, an oxide with indium (In) may be used as the common electrode 52 and an oxide without indium (In) may be used as the oxide semiconductor layer 40, thereby increasing etching selectivity of the common electrode 52 with respect to the oxide semiconductor layer 40.

Further, in order to prevent the oxide semiconductor layer 40 from being etched away when patterning the common electrode 52, the oxide semiconductor layer 40 is preferably made of an oxide with tin (Sn). Since tin (Sn) has a low etch rate, the etching selectivity of the common electrode 52 with respect to the oxide semiconductor layer 40 can be further increased. Usable examples of the oxide semiconductor layer 40 include ZnSnO, GaSnO, GaZnSnO, and the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A liquid crystal display comprising:
an insulating substrate;
a gate electrode disposed on the insulating substrate;
an oxide semiconductor layer disposed on the gate electrode;
an etch stopper disposed on the oxide semiconductor layer in a channel area;
a first electrode disposed on the insulating substrate;
source and drain electrodes separated from each other on the etch stopper and extending to an upper portion of the oxide semiconductor layer;
a passivation layer disposed on the etch stopper, the first electrode, and the source and drain electrodes; and
a second electrode disposed on the passivation layer and connected to the drain electrode,
wherein the source electrode includes a lower source layer and an upper source layer, and the drain electrode includes a lower drain layer and an upper drain layer, and
wherein the lower source layer and the lower drain layer comprise the same material and are disposed on the same layer as the first electrode.

2. The liquid crystal display of claim 1, wherein the oxide semiconductor layer comprises an oxide of a material selected from Zn, In, Ga, Sn, and combinations thereof.

3. The liquid crystal display of claim 1, wherein the lower source layer and the upper source layer have substantially the same patterns with each other, and the lower drain layer and the upper drain layer have substantially the same patterns with each other.

4. The liquid crystal display of claim 1, wherein the lower source layer, the lower drain layer, and the first electrode comprise oxide with indium (In), zinc (Zn), or tin (Sn).

5. The liquid crystal display of claim 1, wherein the upper source layer and the upper drain layer comprise aluminum (Al), copper (Cu), silver (Ag), molybdenum (Mo), chromium (Cr), titanium (Ti), tantalum (Ta), nickel (Ni), cobalt (Co), or alloys thereof.

6. The liquid crystal display of claim 1, wherein the etch stopper comprises oxide, nitride, or oxynitride.

7. The liquid crystal display of claim 1, further comprising a first electrode line arranged on the insulating substrate in parallel with the gate electrode, wherein the first electrode line is connected to the first electrode.

8. The liquid crystal display of claim 1, wherein the first electrode is a common electrode.

9. The liquid crystal display of claim 1, wherein the second electrode is a pixel electrode.

10. A liquid crystal display comprising:
an insulating substrate;
a gate electrode disposed on the insulating substrate;
an oxide semiconductor layer disposed on the gate electrode;
an etch stopper disposed on the oxide semiconductor layer in a channel area;
a first electrode disposed on the insulating substrate;
source and drain electrodes separated from each other on the etch stopper and extending to an upper portion of the oxide semiconductor layer;
a passivation layer disposed on the etch stopper, the first electrode, and the source and drain electrodes;
a second electrode disposed on the passivation layer and connected to the drain electrode; and
a first electrode connecting portion for connecting first electrode disposed at adjacent pixels,
wherein the first electrode connecting portion comprises the same material and is disposed on the same layer as the first electrode.

11. A liquid crystal display comprising:
an insulating substrate;
a gate electrode disposed on the insulating substrate;
an oxide semiconductor layer disposed on the gate electrode;
an etch stopper disposed on the oxide semiconductor layer in a channel area;
a first electrode disposed on the insulating substrate;
source and drain electrodes separated from each other on the etch stopper and extending to an upper portion of the oxide semiconductor layer;
a passivation layer disposed on the etch stopper, the first electrode, and the source and drain electrodes;
a second electrode disposed on the passivation layer and connected to the drain electrode; and
an additional gate electrode disposed on the passivation layer, the additional gate electrode overlapping with the gate electrode.

12. The liquid crystal display of claim 11, wherein the additional gate electrode is connected to the gate electrode through a contact hole disposed in the passivation layer.

13. A liquid crystal display comprising:
an insulating substrate;
a gate electrode disposed on the insulating substrate;
an oxide semiconductor layer disposed on the gate electrode;

an etch stopper disposed on the oxide semiconductor layer in a channel area;

a first electrode disposed on the insulating substrate;

source and drain electrodes separated from each other on the etch stopper and extending to an upper portion of the oxide semiconductor layer;

a passivation layer disposed on the etch stopper, the first electrode, and the source and drain electrodes; and a second electrode disposed on the passivation layer and connected to the drain electrode, wherein the second electrode includes a plurality of main field generating portions separated from each other by cut-out portions, and includes connecting portions connecting the plurality of main field generating portions.

14. A liquid crystal display comprising:

an insulating substrate;

a gate electrode disposed on the insulating substrate;

an oxide semiconductor layer disposed on the gate electrode;

a first electrode disposed on the insulating substrate;

source and drain electrodes separated from each other and extending to an upper portion of the oxide semiconductor layer;

a passivation layer disposed on the first electrode and the source and drain electrodes; and a second electrode disposed on the passivation layer and connected to the drain electrode, wherein the source electrode includes a lower source layer and an upper source layer, and the drain electrode includes a lower drain layer and an upper drain layer, and wherein the lower source layer and the lower drain layer comprise the same material and are disposed on the same layer as the first electrode.

15. A liquid crystal display comprising:

an insulating substrate;

a gate electrode disposed on the insulating substrate;

an oxide semiconductor layer disposed on the gate electrode;

a first electrode disposed on the insulating substrate;

source and drain electrodes separated from each other and extending to an upper portion of the oxide semiconductor layer;

a passivation layer disposed on the first electrode and the source and drain electrodes;

a second electrode disposed on the passivation layer and connected to the drain electrode; and an additional gate electrode disposed on the passivation layer, the additional gate electrode overlapping with the gate electrode.

16. A liquid crystal display comprising:

an insulating substrate;

a gate electrode disposed on the insulating substrate;

a gate insulating layer disposed on the gate electrode and the insulating substrate;

an oxide semiconductor layer disposed on the gate insulating layer;

a first electrode disposed on the gate insulating layer;

a source electrode and a drain electrode separated from each other and extending to an upper portion of the oxide semiconductor layer, wherein the source electrode includes a lower source layer and an upper source layer, and the drain electrode includes a lower drain layer and an upper drain layer, and wherein the lower source layer and the lower drain layer comprise the same material and are disposed on the same layer as the first electrode.

17. The liquid crystal display of claim 16, wherein the lower source layer and the upper source layer have substantially the same patterns with each other, and the lower drain layer and the upper drain layer have substantially the same patterns with each other.

* * * * *